United States Patent

Liberatore et al.

[11] Patent Number: 6,160,469
[45] Date of Patent: Dec. 12, 2000

[54] LARGE VALUE BURIED INDUCTORS IN LOW TEMPERATURE CO-FIRED CERAMIC CIRCUIT BOARDS

[75] Inventors: Michael James Liberatore; Leszek Hozer, both of Lawrenceville, N.J.; Je-Do Mun; In-Tae Kim, both of Kyunggi-Do, Rep. of Korea; Yun-Hwi Park, Seoul, Rep. of Korea; Hyun-Gyu Kang, Seoul, Rep. of Korea; Sung-Dae Park, Seoul, Rep. of Korea

[73] Assignees: Sarnoff Corporation, Princeton, N.J.; Daewoo Electronics Co., Ltd., Seoul, Rep. of Korea

[21] Appl. No.: 09/218,862

[22] Filed: Dec. 23, 1998

Related U.S. Application Data
[60] Provisional application No. 60/102,773, Oct. 2, 1998.
[51] Int. Cl.$^7$ .............................. H01F 27/28; H01F 5/00
[52] U.S. Cl. ......................... 336/200; 336/223; 336/232
[58] Field of Search ................................ 336/200, 223, 336/232

[56] References Cited

U.S. PATENT DOCUMENTS

| | | |
|---|---|---|
| 3,954,434 | 5/1976 | Kobayashi et al. . |
| 4,731,297 | 3/1988 | Takaya . |
| 5,045,380 | 9/1991 | Kobayashi et al. . |
| 5,216,207 | 6/1993 | Prabhu et al. ............................ 174/256 |
| 5,592,134 | 1/1997 | Ogata et al. . |
| 5,725,808 | 3/1998 | Tormey et al. ............................ 252/514 |
| 5,858,548 | 1/1999 | Kirino et al. . |
| 5,953,203 | 9/1999 | Tormey et al. ............................ 361/313 |

FOREIGN PATENT DOCUMENTS 5-55044A  3/1993  Japan ..................................... 336/200

Primary Examiner—Michael L. Gellner
Assistant Examiner—Anh Mai
Attorney, Agent, or Firm—William J. Burke

[57] ABSTRACT

Large value embedded inductors are made by screen printing an inductor coil onto one or more ferrite tapes, and covering the ferrite tapes with one or more ferrite tape layer or layers. Low firing temperature green tapes surround the ferrite layer or layers. These green tapes can be expansion matched to gallium arsenide.

12 Claims, 1 Drawing Sheet

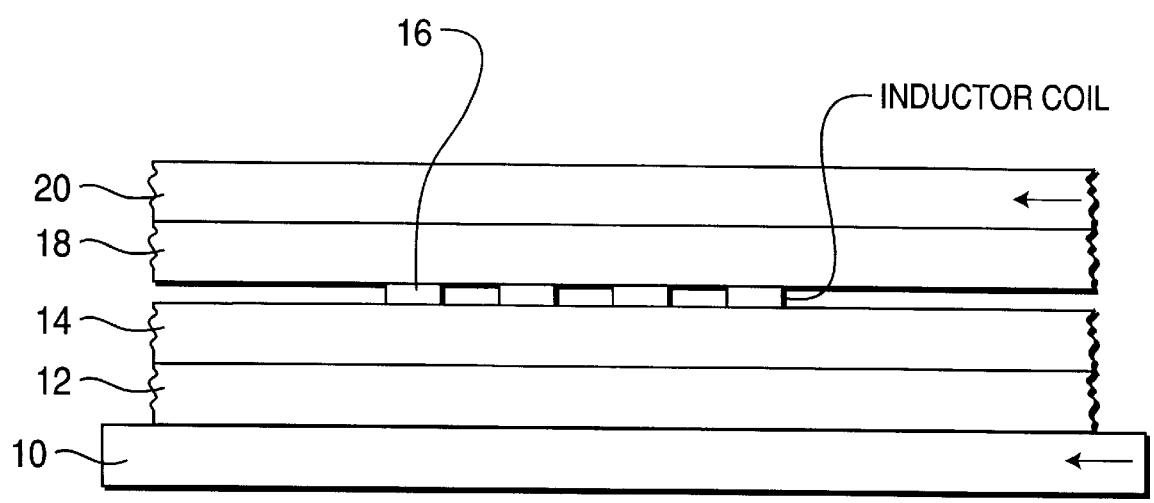

LARGE VALUE BURIED INDUCTORS IN LOW TEMPERATURE CO-FIRED CERAMIC CIRCUIT BOARDS

This application claims the benefit of U.S. Provisional Application Ser. No. 60/102,773 filed Oct. 2, 1998.

This invention relates to multilayer ceramic printed circuit boards including buried co-fired high value inductors. More particularly, this invention relates to screen printed inductors that can be embedded in multiple layers of low temperature firing green tapes.

BACKGROUND OF THE INVENTION

Low temperature firing multilayer ceramic circuit boards are known that are suitable for use with low melt temperature conductive metals, such as silver, gold and copper. These metals can be screen printed onto green tapes to form a desired circuitry. The multilayer circuit boards have a low thermal coefficient of expansion (TCE) and they may be formulated to be compatible with the TCE of both silicon and gallium arsenide devices. These ceramic circuit boards are made from glasses that can be fired at temperatures of less than 1000° C. They are made by admixing finely divided selected glass particles or powders and optional inorganic fillers with organic materials, such as resin, solvents, dispersant and the like; the resultant slurry is cast as a thin tape, called green tape. A circuit pattern may be screen printed onto the green tape using a conductive ink formulation comprising a conductive metal powder, an organic vehicle and a powdered glass, generally the same as, or a similar glass to, that used to make the green tape.

When a plurality of green tapes are stacked together, via holes are formed in the tapes, which vias are then filled with a conductive via fill ink made with a conductive powder, an organic vehicle and a suitable glass, to provide electrical contact between the circuits on adjoining green tape layers. When all of the desired green tapes have been patterned and the vias are filled, the green tapes are aligned and then laminated under heat and pressure, and fired to remove the organic materials and densify the glass.

More recently, the multilayer ceramic circuit boards have been adhered to a metal support substrate, which increases the strength of the multilayer board. When a suitable bonding glass is used to adhere the green tapes to the support substrate, an additional advantage is obtained because the bonding glass reduces the shrinkage in the x and y dimensions of the green tapes during firing. Thus most of the shrinkage occurs only in the z, or thickness, dimension and the printed circuits can be formed to tighter tolerances. The glasses used in the green tapes however, must have a TCE matched to that of the metal support to prevent delamination or cracking of the fired glass. Mixtures of crystallizable and non-crystallizable glasses can be used for example, and inorganic fillers can also be used to match the TCE of the fired green tape ceramic to that of the metal support.

Green tape glasses suitable for use in the present invention are mixtures of crystallizable glass compositions mixed with non-crystallizing glasses, which can further include oxide fillers. These glasses are particularly useful for metal supported printed ceramic circuit boards. The crystallizing glasses are chosen from ZnO, MgO, $B_2O_3$ and silica systems, and preferably are made from 20–55% by weight of ZnO, from 10–30% by weight of MgO, from 10–35% by weight of boron oxide and 10–40% by weight of silica. These glasses can also include up to 10% by weight of alumina and up to 3% by weight of a coloring agent, such as cobalt oxide. These crystallizing glasses are mixed with non-crystallizing glasses or vitreous glasses chosen from lead-based glass compositions including 30–80% by weight of lead oxide, from 15–50% by weight of silica, up to 10% by weight of alumina, up to 15% by weight of boron oxide and up to 20% by weight of zinc oxide. In addition, one or more oxide fillers such as alumina, cordierite, quartz, forsterite and willemite can also be added to control the shrinkage and modify the TCE of the green tape. These glass mixtures are used to form green tapes that can be aligned and laminated together and adhered to the support board. These glasses and mixtures and their green tapes are further described in U.S. Pat. No. 5,725,808 to Torney et al which is herein incorporated by reference.

Particularly useful metal support boards are made of a ferro/nickel/cobalt/manganese alloy, clad with a thin copper layer, available under the trademark KOVAR® of Carpenter Technology.

Passive components such as resistors and capacitors can also be embedded in a green tape stack. Suitable resistor or capacitor inks can be screen printed onto green tapes to obtain tight tolerances and high precision placement of the passive components.

However, when screen printed inductors were tried using the above techniques, they had low Q values of less than 50, and inductor values of less than several hundred nanohenries (nH).

High value discrete inductors can be formed by surrounding the inductor with a high permeability ferrite. However, this cannot be transferred directly to the fabrication of multilayer embedded green tape inductors because the firing temperature of such ferrites is much higher than the firing temperature of the present green tape glasses. The addition of a flux or sintering aid has been suggested to lower the sintering temperature of ferrites, but these generally have the effect of lowering the permeability of the ferrite as well. Further, ferrites must be compatible with the glasses and other materials used to make the green tapes, and must have a TCE fairly close to that of the ceramics used to make the green tapes. Such constraints are not trivial, but a search has continued for high permeability ferrites that can be used in the present multilayer metal supported ceramic circuit board system.

SUMMARY OF THE INVENTION

We have found a ferrite tape composition and a screen printable conductor ink that can be used to make compatible embedded inductors for low temperature firing, metal supported, multilayer ceramic green tape circuit boards. The green tapes have a TCE compatible with gallium arsenide. The inductor coil is screen printed onto a high permeability ferrite layer that includes a low melting flux in an amount sufficient to lower the firing temperature of the ferrite to that of the green tape. The ferrite layers are made from a ferrite powder, a resin solution and a dispersant solution that is mixed and cast to make a ferrite tape layer. Inductors are made by screen printing inductor coils on a ferrite tape layer using a conductive ink made from gold powder, a suitable dispersant and a resin/solvent mixture. One or more additional ferrite layers can be mounted above and/or below the printed ferrite layer. The inductor layer is embedded between green tape layers. The resultant stack is aligned, laminated and fired to remove the organics and sinter the glass of the green tape.

BRIEF DESCRIPTION OF THE DRAWING

The FIGURE is a cross sectional view of an embedded inductor of the invention.

DETAILED DESCRIPTION OF THE INVENTION

The green tapes suitable for use in the invention are made from a mixture of a crystallizable zinc-magnesium-borosilicate glass and a lead-based vitreous glass. Suitable glasses comprise, for the crystallizable glass, about 20–55%, preferably 25–30% by weight of zinc oxide, from about 10–30%, preferably about 20–28% by weight of magnesium oxide, about 10–35%, preferably 15–20% by weight of boron oxide and about 10–40%, preferably about 20–30% by weight of silicon dioxide. A small amount, up to about 10%, preferably from about 3–7% by weight, of aluminum oxide can also be added.

A suitable vitreous glass comprises up to about 10% by weight of aluminum oxide, about 30–80% by weight of lead oxide, from about 15–50% by weight of silica, up to about 15% by weight of boron oxide and up to about 10% by weight of zinc oxide.

The green tape slurry is made by mixing the above glasses, together with desired inorganic fillers, with a dispersant solution and a resin solution. As an example, about 150 parts by weight of the crystallizable glass having a median particle size of about 8.5–10.5 microns, was mixed with 11.94 parts by weight of forsterite powder having a median particle size of 2.6 microns, 18.68 parts by weight of the non-crystallizing glass having a median particle size of 4–6 microns, 8.55 parts by weight of cordierite powder having a median particle size of 2–3 microns, 0.48 parts by weight of chromium oxide powder as a coloring agent, 39.1 parts by weight of a dispersant solution of 40 parts by weight of Hypermer PS2 of ICI Surfactants, and 1000 parts by weight of an equal mixture of ethanol and methyl ethyl ketone and 32.7 parts by weight of a resin solution of 288 parts by weight of Butvar B98 resin commercially available from Monsanto, 192 parts by weight of Santicizer #160, also from Monsanto, 620 parts by weight of ethanol and 620 parts by weight of methyl ethyl ketone.

The above mixture was milled for two hours, and cast into green tape using a 12 mil doctor blade.

Referring now to the FIGURE, a green tape stack 12 is mounted on the metal support substrate 10 and a layer 14 of a ferrite tape of the invention is applied to the green tape stack 12. An inductor coil 16 is screen printed onto the ferrite tape 14. The coil 16 is embedded by placing a second ferrite tape 18 over the screen printed coil 16. A final green tape stack layer 20 is aligned with the green tape stack 12.

Although referred to above as a layer, the green tape stacks 12 and 20, and the ferrite tapes 14 and 18 can comprise one or a plurality of tape layers aligned and laminated together. In general, the more ferrite present about the screen printed coil, the higher the inductance can be.

Suitable ferrite tapes can be made from a slurry of Series 276 ferrite (nickel-manganese-copper oxide) powder having an average particle size of 1.35 microns, which is commercially available from Steward Inc of Chattanooga, Tenn. The powder is mixed with a low melting flux, such as bismuth oxide, in an amount sufficient to promote sintering of the ferrite at the firing temperature of the green tape system used. A resin solution and a dispersant solution are also added. The resultant slurry is ball milled for at least two hours with ⅜" zirconia balls and formed into a tape by doctor blading using a 17 mil gap. After drying, the ferrite tape is about 7–8 mils thick.

Inductor coils are then screen printed onto the ferrite tape using a metallization ink. A suitable metallization ink is made from gold powder, a dispersant and a resin solution.

In order to increase the inductor values, a plurality of ferrite tapes can be stacked together on either or both sides of the screen printed inductor coils. In turn, the ferrite embedded inductor can be mounted on a multilayer green tape stack, in turn mounted on a metal support board formed in conventional manner.

The invention will be further described in the following examples, but the invention is not meant to be limited to the details described therein.

EXAMPLES 1–4

In the examples, the green tapes were made from the following glasses: the crystallizable glass was made from 103.72 grams of zinc oxide powder, 103.0 grams of magnesium oxide powder, 78.2 grams of boric anhydride powder, 115.08 grams of silicon dioxide powder and 20.0 grams of alumina powder. The oxides were melted at 1550° C. for three hours and ground. The vitreous glass was made from 80.0 grams of alumina powder, 336.0 grams of lead oxide powder, 304.0 grams of silica powder and 80.0 grams of zinc oxide powder. The oxides were mixed, melted at 1895° C. for ten minutes and ground. These glasses and various mixtures thereof are disclosed in U.S. Pat. No. 5,725,808 to Tormey et al, and incorporated herein by reference.

150 Grams of the crystallizable glass having a median particle size of 8.5–10.5 microns, 18.68 grams of the vitreous glass having a particle size of 4–6 microns, 11.94 grams of forsterite having a median particle size of 2.6 microns, 8.55 grams of cordierite powder having a particle size of 2–3 microns, and 0.48 gram of chromium oxide powder were mixed together with 39.1 grams of a solution of 40.0 grams of Hypermer PS2 surfactant available from ICI Surfactants, 500 grams of anhydrous ethanol and 500 grams of methyl ethyl ketone solvents, and 32.7 grams of a resin solution containing 288 grams of Butvar B98, a polyvinyl butyral resin and a trademark of Monsanto Co, 192 grams of Santicizer 160, also from Monsanto, 620 grams of ethanol and 620 grams of methyl ethyl ketone. Other ingredients suitable for making green tapes are disclosed in U.S. Pat. No. 5,216,207 to Prabhu et al, also incorporated herein by reference.

The solids and solutions were milled for two hours and cast into green tape using a 12 mil doctor blade.

A ferrite tape was prepared by ball milling a mixture containing 72.73 % by weight of ferrite powder, 14.84 % by weight of a resin solution comprising 16.7% of Butvar B-98 resin and 11.1% of Santicizer #160 available from Monsanto Corp, 36.1% of ethanol and 36.1% of methyl ethyl ketone, and with 12.44% of a dispersant solution containing 3.8% of Hypermer PS2 from ICI Surfactants, 48.1% of ethanol and 49.1 of methyl ethyl ketone (all percent by weight).

The mixture was ball milled for two hours and cast into a tape as described above.

Inductors were screen printed as coils on the ferrite tape, or directly onto a green tape, from an inductor metallization ink comprising 91.9% by weight of gold powder available as #304FS from PGP Corporation, 1.94% by weight of Hypermer PS2 surfactant and 6.25% by weight of a resin solution comprised of ethyl cellulose having a molecular weight of about 300 available from Aqualon Corporation in a 60% by weight butyl carbitol/40% dodecanol solvent.

Inductor spirals were printed on the ferrite tapes and, as a Control, on green tapes alone, in three sizes: 0.24 inch, 0.38 inch and 0.56 inch, and in three different line widths and spacings, 4, 6 and 8 mils respectively. Printed multilayer ferrite stacks were made with different numbers of ferrite tapes, up to 4, combined with the green tape stacks. The resultant assemblies were laminated together and co-laminated to a metal, copper clad Kovar® board.

The resultant boards were fired over a period of 4.5 hours to a peak temperature of 865° C.

The fired boards including the embedded inductors were measured for inductance at a frequency of 200 kHz using a Hewlett Packard 4190 LCR bridge. The results are summarized in the Table below, wherein Example 1 is a fired embedded inductor without any ferrite layer; Example 2 is a fired embedded inductor screen printed onto a single ferrite layer; Example 3 is a fired embedded inductor screen printed onto a stack of two ferrite layers and buried with one overlying ferrite layer; and Example 4 is a fired embedded inductor screen printed onto a stack of two ferrite layers and buried with two overlying ferrite tape layers.

| Inductor | Size mils | Line Width | Example 1 L(nH) | Example 2 L(nH) | Example 3 (nH) | Example 4 L(nH) |
|---|---|---|---|---|---|---|
| 1 | 240 | 8 | 0.059 | 0.163 | 0.743 | 1.152 |
| 2 | 380 | 6 | 0.308 | 1.210 | 3.816 | 5.897 |
| 3 | 240 | 6 | 0.109 | 0.261 | 1.226 | 1.909 |
| 4 | 240 | 4 | 0.206 |  | 2.563 | 4.11 |
| 5 | 240 | 4 | 0.220 |  | 2.569 | 4.14 |
| 6 | 380 | 6 | 0.379 | 1.240 | 4.096 | 6.26 |
| 7 | 380 | 8 | 0.182 | 0.739 |  | 3.65 |
| 8 | 560 | 6 | 0.676 | 3.410 | 8.162 | 12.925 |
| 9 | 560 | 8 | 0.385 | 1.620 | 4.663 | 7.46 |
| 10 | 560 | 8 | 0.420 | 1.740 | 4.845 | 7.6 |
| 11 | 560 | 4 | 1.283 | 6.670 | 16.080 | 25.9 |
| 12 | 380 | 4 | 0.630 | 2.400 |  | 11.52 |

When no ferrite layers were used, as in Example 1, the lowest inductance was obtained. As the amount of ferrite surrounding the inductors increased, the inductance also increased. Several inductances were measured to be over 10 nH The number of ferrite layers present can vary, up to a thickness wherein the inductance reaches a saturation point, determined by the size of the screen printed coil.

Other ferrites can be substituted providing low melt temperature glasses and other oxide powders can be added so that the firing temperature of the ferrite tape can be made to be about 850–900° C.

Although the invention has been described in terms of specific embodiments, various changes can be made to the composition and materials of the support board, the green tapes, the ferrite composition, the size of the coils and the like. The invention is only meant to be limited by the scope of the appended claims.

We claim:

1. A multilayer tape stack comprising a green tape stack, a first ferrite tape made from the composition comprising a ferrite powder and a low melt temperature oxide modifier in sufficient amount so that the ferrite sinters at a temperature below about 900° C., a resin solution and a dispersant solution, a conductive coil screen printed from a metallization ink onto the first ferrite tape, and a second ferrite tape having the same composition as the first ferrite tape overlying the coil.

2. A multilayer tape stack according to claim 1 wherein the second ferrite tape is made from a plurality of said ferrite tape layers.

3. A multilayer tape stack according to claim 1 wherein the green tape stack has a coefficient of expansion matched to that of gallium arsenide.

4. A multilayer tape stack of claim 1 wherein the ferrite tape has a coefficient of expansion matched to that of the green tape composition.

5. A multilayer tape stack of claim 1 wherein the metallization ink is made from gold powder, a dispersant and a resin solution.

6. A multilayer tape stack of claim 1 wherein the low melt temperature oxide is bismuth oxide.

7. An embedded inductor made by firing the multilayer tape stack of claim 1.

8. A multilayer tape stack according to claim 1 wherein the green tape stack is mounted on a metal support substrate.

9. An embedded inductor according to claim 8 wherein the metal support is a ferro/nickel/cobalt/manganese alloy.

10. A multilayer tape stack according to claim 1 wherein the first ferrite tape is made from a plurality of said ferrite tape layers.

11. A multilayer tape stack according to claim 10 wherein a second green tape stack is mounted over the second ferrite tape stack.

12. An embedded inductor made by firing the multilayer tape stack of claim 11.

* * * * *